(12) United States Patent
Wang

(10) Patent No.: US 11,322,716 B2
(45) Date of Patent: May 3, 2022

(54) FLEXIBLE LIGHT-EMITTING PANEL, METHOD OF MANUFACTURING FLEXIBLE LIGHT-EMITTING PANEL, AND DISPLAY DEVICE

(71) Applicant: Wuhan China Star Optoelectronics Semiconductor Display Technology Co., Ltd., Wuhan (CN)

(72) Inventor: Fang Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 259 days.

(21) Appl. No.: 16/625,762

(22) PCT Filed: Oct. 22, 2019

(86) PCT No.: PCT/CN2019/112432
§ 371 (c)(1),
(2) Date: Dec. 23, 2019

(87) PCT Pub. No.: WO2021/017198
PCT Pub. Date: Feb. 4, 2021

(65) Prior Publication Data
US 2021/0367193 A1  Nov. 25, 2021

(30) Foreign Application Priority Data

Aug. 1, 2019  (CN) .......................... 201910706407.9

(51) Int. Cl.
*H01L 51/52*  (2006.01)
*H01L 27/32*  (2006.01)
*H01L 51/56*  (2006.01)

(52) U.S. Cl.
CPC ........ *H01L 51/5246* (2013.01); *H01L 27/323* (2013.01); *H01L 51/5293* (2013.01); *H01L 51/56* (2013.01); *H01L 2251/5338* (2013.01)

(58) Field of Classification Search
CPC .............. H01L 51/5246; H01L 27/323; H01L 51/5293; H01L 51/56; H01L 2251/5338
See application file for complete search history.

(56) References Cited

U.S. PATENT DOCUMENTS

2017/0229665 A1* 8/2017 Park .................... H01L 51/0097
2018/0013092 A1  1/2018 Park

FOREIGN PATENT DOCUMENTS

| CN | 206076240 | 4/2017 |
| CN | 108183126 | 6/2018 |
| CN | 108550607 | 9/2018 |

* cited by examiner

*Primary Examiner* — Kyoung Lee

(57) ABSTRACT

The flexible light-emitting panel, the manufacturing method thereof and the display device, the flexible light-emitting panel comprises: a backplate; the adhesive layer comprises a first sub-adhesive layer disposed on the backplate and a plurality of protrusions from the first sub-adhesive layer away from the backplate a second sub-adhesive layer; the flexible layer is disposed on the first sub-adhesive layer, and the flexible layer comprises a plurality of spaced sub-flexible layers, the second sub-adhesive layer is located at spacings; and an array is sequentially stacked on each sub-flexible layer The substrate, the light-emitting component and the encapsulation layer; the cover plate is disposed on the encapsulation layer and the second sub-adhesive layer.

13 Claims, 3 Drawing Sheets

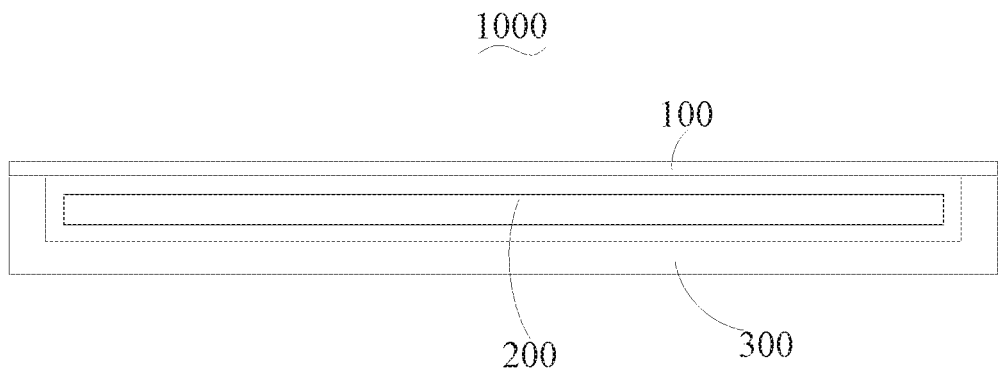

FIG. 1

```
┌─────────────────────────────────────────┐
│ providing a substrate;                  │── 101
└─────────────────────────────────────────┘
                    ⇩
┌─────────────────────────────────────────┐
│ coating a plurality of sub-flexible layers spaced apart from │
│ each other on the substrate to form a flexible layer on the  │── 102
│ substrate;                              │
└─────────────────────────────────────────┘
                    ⇩
┌─────────────────────────────────────────┐
│ forming an array substrate, a light-emitting component, and  │
│ an encapsulation layer sequentially on each of the plurality │
│ of sub-flexible layers, and disposing a cover plate covering │── 103
│ the encapsulation layer;                │
└─────────────────────────────────────────┘
                    ⇩
┌─────────────────────────────────────────┐
│ peeling off the substrate, applying an adhesive to a first   │
│ surface of the flexible layer away from the encapsulation    │── 104
│ layer and spacings between adjacent ones of the sub-flexible │
│ layers, and curing the adhesive to form an adhesive layer;   │
└─────────────────────────────────────────┘
                    ⇩
┌─────────────────────────────────────────┐
│ attaching a backplate to a second surface of the adhesive    │── 105
│ layer away from the encapsulation layer.│
└─────────────────────────────────────────┘
```

FIG. 2

FLEXIBLE LIGHT-EMITTING PANEL, METHOD OF MANUFACTURING FLEXIBLE LIGHT-EMITTING PANEL, AND DISPLAY DEVICE

RELATED APPLICATIONS

This application is a National Phase of PCT Patent Application No. PCT/CN2019/112432 having International filing date of Oct. 22, 2019, which claims the benefit of priority of Chinese Patent Application No. 201910706407.9 filed on Aug. 1, 2019. The contents of the above applications are all incorporated by reference as if fully set forth herein in their entirety.

FIELD AND BACKGROUND OF THE INVENTION

The present application relates to a field of display technologies, and in particular, to a flexible light-emitting panel, a method of manufacturing a flexible light-emitting panel, and a display device.

In recent years, with development of display technologies, display devices such as mobile phones, tablet computers, and the like are accepted by users due to their portability, and bendable displays have advantages of being able to be bent, distorted, or rolled up compared to general displays, so that requirements for a display of high resolution and large size are no longer contradictory to the portability of the device.

At present, a flexible light-emitting panel is prepared by disposing a plurality of functional layers such as a light-emitting component and a thin film encapsulation layer (TFE) on a flexible substrate, in order to maintain its bendability, and when the flexible light-emitting panel is bent, interlayer peeling between a plurality of functional layers may occur because the bending stress is not sufficiently released.

SUMMARY OF THE INVENTION

The embodiment of the present invention provides a flexible light-emitting panel, a method of manufacturing a flexible light-emitting panel, and a display device, which can avoid interlayer peeling between a plurality of functional layers of the flexible light-emitting panel, thereby improving product yield.

In a first aspect, an embodiment of the present application provides a flexible light-emitting panel, including:

a backplate;

an adhesive layer comprising a first sub-adhesive layer disposed on the backplate and a plurality of second sub-adhesive layers protruding from the first sub-adhesive layer away from the backplate;

a flexible layer disposed on the first sub-adhesive layer, and comprising a plurality of sub-flexible layers spaced apart from each other, the second sub-adhesive layers disposed at spacings between the sub-flexible layers, and the second sub-adhesive layers corresponding to the spacings one-to-one;

an array substrate, a light-emitting component, and an encapsulation layer sequentially stacked on each of the sub-flexible layers; and a cover plate covering and disposed on the encapsulation layer and the second sub-adhesive layers.

In the flexible light-emitting panel according to the present application, the flexible light-emitting panel comprises at least one bending region, and at least one of the plurality of sub-flexible layers is located in the bending region.

In the flexible light-emitting panel according to the present application, the second sub-layer has a width same as a width of the spacing.

In the flexible light-emitting panel according to the present application, the adhesive layer has a thickness same as a distance from the backplate to the cover plate.

In the flexible light-emitting panel according to the present application, the second sub-layer has a width of 1 to 3 microns.

In the flexible light-emitting panel according to the present application, a polarizer and a touch panel are further disposed between the encapsulation layer and the cover plate, wherein the polarizer is disposed on the encapsulation layer, and the touch panel is disposed on the polarizer.

In a second aspect, the embodiment of the present application further provides a method of manufacturing a flexible light-emitting panel, including:

providing a substrate;

coating a plurality of sub-flexible layers spaced apart from each other on the substrate to form a flexible layer on the substrate;

forming an array substrate, a light-emitting component, and an encapsulation layer sequentially on each of the plurality of sub-flexible layers, and disposing a cover plate covering the encapsulation layer;

peeling off the substrate, applying an adhesive to a first surface of the flexible layer away from the encapsulation layer and spacings between adjacent ones of the sub-flexible layers, and curing the adhesive to form an adhesive layer; and attaching a backplate to a second surface of the adhesive layer away from the encapsulation layer.

In the method of manufacturing the flexible light-emitting panel according to the present application, the step of peeling off the substrate comprises:

irradiating the substrate with laser under vacuum to peel off the substrate from the flexible layer.

In the method of manufacturing the flexible light-emitting panel according to the present application, the step of applying an adhesive to a first surface of the flexible layer away from the encapsulation layer and spacings between adjacent ones of the sub-flexible layers, and curing the adhesive to form an adhesive layer comprises:

applying the adhesive to the first surface of the flexible layer away from the encapsulation layer and the spacings between adjacent ones of the sub-flexible layers; and curing the adhesive by UV light to form the adhesive layer.

In a third aspect, an embodiment of the present application further provides a display device, including: a flexible light-emitting panel and a housing, the flexible light-emitting panel is disposed on the housing, and the flexible light-emitting panel includes:

an adhesive layer comprising a first sub-adhesive layer disposed on the backplate and a plurality of second sub-adhesive layers protruding from the first sub-adhesive layer away from the backplate;

a flexible layer disposed on the first sub-adhesive layer, and comprising a plurality of sub-flexible layers spaced apart from each other, the second sub-adhesive layers disposed at spacings between the sub-flexible layers, and the second sub-adhesive layers corresponding to the spacings one-to-one;

an array substrate, a light-emitting component, and an encapsulation layer sequentially stacked on each of the sub-flexible layers; and a cover plate covering and disposed on the encapsulation layer and the second sub-adhesive layers;

wherein the flexible light-emitting panel comprises at least one bending region, and at least one of the plurality of sub-flexible layers is located in the bending region; and wherein the display device further comprises a polarizer and a touch panel disposed between the encapsulation layer and the cover plate, wherein the polarizer is disposed on the encapsulation layer, and the touch panel is disposed on the polarizer.

In the display device according to the present application, the second sub-layer has a width same as a width of the spacing.

In the display device according to the present application, the adhesive layer has a thickness same as a distance from the backplate to the cover plate.

In the display device according to the present application, the second sub-layer has a width of 1 to 3 microns.

The flexible light-emitting panel provided by an embodiment of the present invention includes: a backplate; an adhesive layer comprising a first sub-adhesive layer disposed on the backplate and a plurality of second sub-adhesive layers protruding from the first sub-adhesive layer away from the backplate; a flexible layer disposed on the first sub-adhesive layer, and comprising a plurality of sub-flexible layers spaced apart from each other, the second sub-adhesive layers disposed at spacings between the sub-flexible layers, and the second sub-adhesive layers corresponding to the spacings one-to-one; an array substrate, a light-emitting component, and an encapsulation layer sequentially stacked on each of the sub-flexible layers; and a cover plate covering and disposed on the encapsulation layer and the second sub-adhesive layers. The present application can avoid the occurrence of interlayer peeling between a plurality of functional layers of the flexible light-emitting panel, thereby improving the product yield.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

FIG. 1 is a schematic structural diagram of a display device according to an embodiment of the present application.

FIG. 2 is a schematic flow chart of a method of fabricating a flexible light-emitting panel according to an embodiment of the present application

DESCRIPTION OF SPECIFIC EMBODIMENTS OF THE INVENTION

Figure 3:
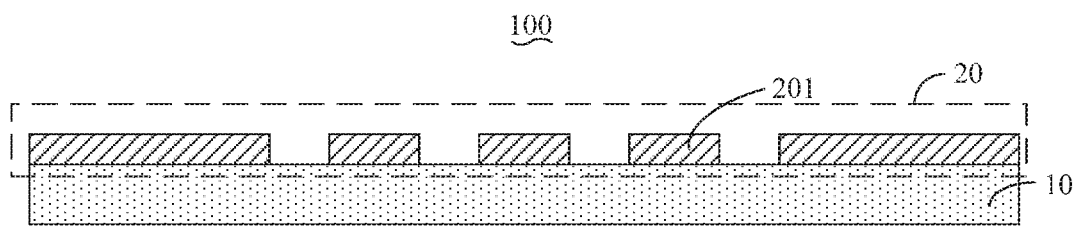
FIG. 3 is a schematic diagram of a first intermediate product during fabricating a flexible light-emitting panel according to an embodiment of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the related art, in order to satisfy the bending property of a flexible display device, a light-emitting component needs to be prepared on the flexible substrate. Therefore, PI is first coated on the glass substrate, and then subsequent array and electroluminescent (EL) processes are performed to complete the preparation and packaging of the flexible display device. However, external mechanism designs incorporating flexible light-emitting panels typically include hinges to complete the bending of the entire display device. In an in-folding mobile device, an inner panel of the casing will sag with a movement of the hinge due to the closing of the casing, thereby reducing the stress between the panel and the mechanism, preventing peeling of the bonding area. However, even with such a design, the panel is still subjected to different degrees of squeezing and pulling during bending. For a thin film encapsulation layer (TFE), an electroluminescent layer (EL), and an array each containing an inorganic layer, interlayer peeling may occur because the laminate is subjected to pulling or insufficient stress release when it is bent, resulting in failure of the entire panel.

An embodiment of the present application further provides a display device, including: a flexible light-emitting panel and a housing, the flexible light-emitting panel is disposed on the housing, and the flexible light-emitting panel includes:

an adhesive layer comprising a first sub-adhesive layer disposed on the backplate and a plurality of second sub-adhesive layers protruding from the first sub-adhesive layer away from the backplate;

a flexible layer disposed on the first sub-adhesive layer, and comprising a plurality of sub-flexible layers spaced apart from each other, the second sub-adhesive layers disposed at spacings between the sub-flexible layers, and the second sub-adhesive layers corresponding to the spacings one-to-one;

an array substrate, a light-emitting component, and an encapsulation layer sequentially stacked on each of the sub-flexible layers; and a cover plate covering and disposed on the encapsulation layer and the second sub-adhesive layers;

wherein the flexible light-emitting panel comprises at least one bending region, and at least one of the plurality of sub-flexible layers is located in the bending region; and wherein the display device further comprises a polarizer and a touch panel disposed between the encapsulation layer and the cover plate, wherein the polarizer is disposed on the encapsulation layer, and the touch panel is disposed on the polarizer.

The second sub-layer has a width same as a width of the spacing.

The adhesive layer has a thickness same as a distance from the backplate to the cover plate.

The second sub-layer has a width of 1 to 3 microns.

Referring to FIG. 1, FIG. 1 is a schematic structural diagram of a display device 1000 according to an embodiment of the present application. The display device 100 may include a flexible light-emitting panel 100, a control circuit 200, and a housing 300. It should be noted that the display device 1000 shown in FIG. 1 is not particularly limited to the above descriptions, and may further include other components, such as a camera, an antenna structure, a pattern unlocking module, and the like.

The flexible light-emitting panel 100 is disposed on the housing 200. The housing may include a mounting mechanism, a hinge structure, and the like (not shown) of the flexible light-emitting panel 100.

In some embodiments, the flexible light-emitting panel 100 may be fixed to the housing 300, and the flexible light-emitting panel 100 and the housing 300 form a sealed space to accommodate devices such as the control circuit 200.

In some embodiments, the housing 300 can be made of a flexible material, for example a plastic housing or a silicone housing.

The control circuit 200 is installed in the housing 300. The control circuit 200 can be a main board of the display device 1000. The control circuit 200 can be integrated with one, two or more of functional components of a battery, an antenna structure, a microphone, a speaker, a headphone interface, a universal serial bus interface, a camera, a distance sensor, an ambient light sensor, a receiver, and a processor.

The flexible light-emitting panel 100 is installed in the housing 300, and meanwhile, the flexible light-emitting panel 100 is electrically connected to the control circuit 200 to form a display surface of the display device 1000. The flexible light-emitting panel 100 may include a display area and a non-display area. The display area is configured to display an image of the display device 1000, serve a user to perform touch control, or the like. The non-display area is configured to accommodate various functional components.

Referring to FIG. 2, FIG. 2 is a schematic flow chart of a method of manufacturing a flexible light-emitting panel according to an embodiment of the present application, including:

Step 110, providing a substrate.

Specifically, the substrate 10 is usually a glass substrate.

Step 120, coating a plurality of sub-flexible layers 201 spaced apart from each other on the substrate 10 to form a flexible layer 20 on the substrate 10.

Specifically, referring to FIG. 3, FIG. 3 is a schematic diagram of a first intermediate product during fabricating a flexible light-emitting panel according to an embodiment of the present application.

Since the flexible layer 20 on the substrate 10 is also bent in the bending direction when the flexible light-emitting panel 100 is bent, if the bending stress is not sufficiently released, the flexible layer 20 may be broken or peeled off from other functional layers thereon. Therefore, the present application applies the flexible layer 20 in sections on the substrate 10, such that the flexible layer 20 can be separated by the spacing between adjacent ones of the sub-flexible layers 201 during bending, to form a segmented flexible layer 20.

Step 130, forming an array substrate 30, a light-emitting component 40, and an encapsulation layer 50 sequentially on each of the plurality of sub-flexible layers 201, and disposing a cover plate 60 covering the encapsulation layer 50.

Figure 4:
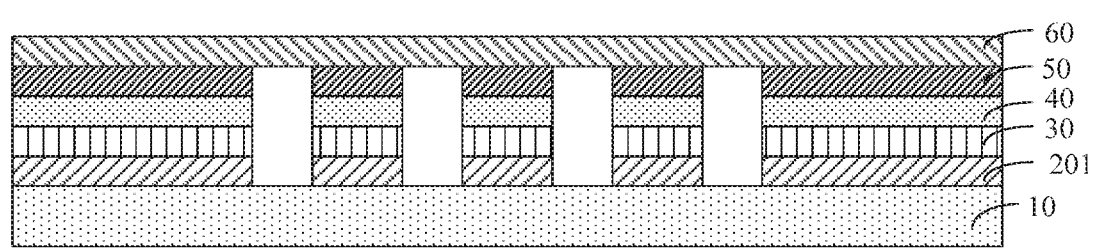
FIG. 4 is a schematic diagram of a second intermediate product during fabricating a flexible light-emitting panel according to an embodiment of the present application.

Specifically, referring to FIG. 4, FIG. 4 is a schematic diagram of a second intermediate product during fabricating a flexible light-emitting panel according to an embodiment of the present application. In order to avoid cracking, breakage, delamination, or interlayer peeling of the functional layers (for example, the array substrate 30, the light-emitting component 40 and the encapsulation layer 50) on the flexible layer 20 during bending, certain spacings are also reserved between the functional layers, which correspond to the spacings between the adjacent ones of the sub-flexible layers 201, such that when the flexible light-emitting panel 100 is bent, the functional layers can also be separated by the spacings to form a segmented functional layer, and the stress generated by the bending is released through the spacings.

The light-emitting component 40 may include a thin film transistor (TFT), a pixel defining layer, and an anode, a hole transporting layer, a light-emitting layer, an electron transporting layer, and a cathode (not shown) sequentially formed on a region defined by the pixel defining layer. When a power is supplied to reach an appropriate voltage, a positive hole and a cathode charge are combined in the light-emitting layer to emit light, thereby producing red, green, and blue (RGB) three primary colors. However, it is not particularly limited to the three colors of RGB, and may also include white (W), which is not particularly limited herein. Of course, the light-emitting component 40 is not particularly limited to an organic light-emitting diode (OLED), but may be a liquid crystal display (LCD) or the like.

Step 140, peeling off the substrate 10, applying an adhesive to a first surface 202 of the flexible layer 201 away from the encapsulation layer 50 and spacings between adjacent ones of the sub-flexible layers 201, and curing the adhesive to form an adhesive layer 70.

Figure 5:
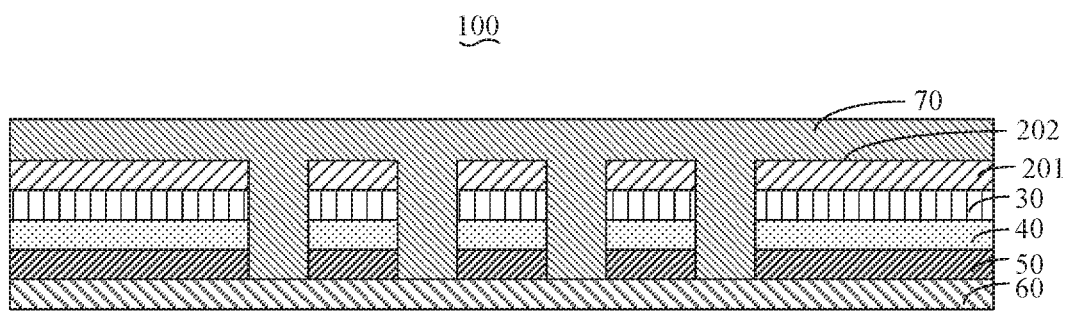
FIG. 5 is a schematic diagram of a third intermediate product during fabricating a flexible light-emitting panel according to an embodiment of the present application.

Specifically, referring to FIG. 5, FIG. 5 is a schematic diagram of a third intermediate product during fabricating a flexible light-emitting panel according to an embodiment of the present application.

The step of peeling off the substrate 10 may be performed by laser lift off (LLO). Therefore, the step may specifically include: irradiating the substrate 10 with laser under vacuum to peel off the substrate 10 from the flexible layer 20.

The step of curing the adhesive may be performed by UV light curing. Therefore, the step of applying an adhesive to a first surface 202 of the flexible layer 20 away from the encapsulation layer 50 and spacings between adjacent ones of the sub-flexible layers 201, and curing the adhesive to form an adhesive layer 70 comprises:

applying the adhesive to the first surface 202 of the flexible layer 20 away from the encapsulation layer 50 and the spacings between adjacent ones of the sub-flexible layers 201; and curing the adhesive by UV light to form the adhesive layer 70.

The purpose of forming the adhesive layer 70 on the first surface 202 and at the spacings between the adjacent ones of the flexible layer 201 is to facilitate stress release of the functional layers and to avoid sagging of the functional layers when the flexible light-emitting panel 100 is bent. When the adhesive is applied, in order to prevent the adhesive from flowing out from a lower side along the spacings, the flexible light-emitting panel shown in FIG. 4 needs to be inverted, and then the coating process is performed.

Step 150, attaching a backplate 80 to a second surface 701 of the adhesive layer 70 away from the encapsulation layer 50.

Figure 6:
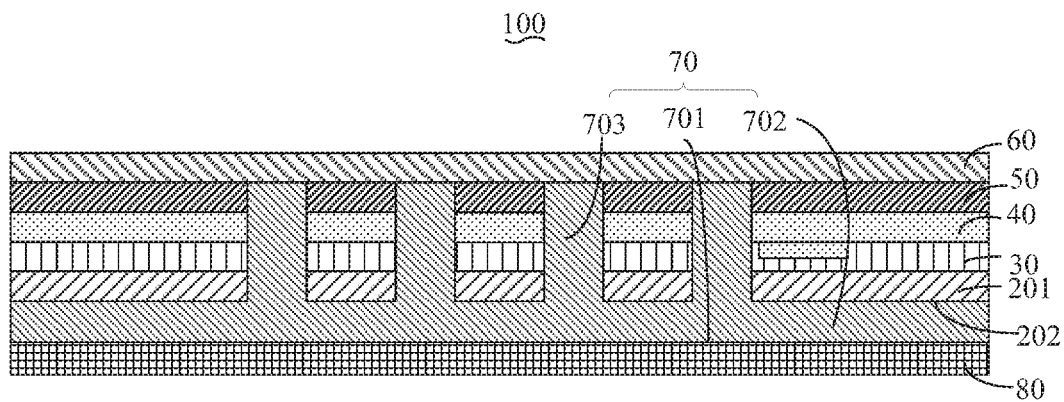
FIG. 6 is a schematic diagram of a first structure of a flexible light-emitting panel according to an embodiment of the present application.

Specifically, referring to FIG. 6, FIG. 6 is a schematic diagram of a first structure of the flexible light-emitting panel 100 according to an embodiment of the present application. After forming the adhesive layer 70, a backplate 80 is attached on the second surface 701 of the adhesive layer away from the encapsulation layer 50 to form a complete flexible light-emitting panel 100.

Accordingly, the flexible light-emitting panel 100 includes:

a backplate 80;

an adhesive layer 70 comprising a first sub-adhesive layer 702 disposed on the backplate 80 and a plurality of second sub-adhesive layers 703 protruding from the first sub-adhesive layer 702 away from the backplate 80;

a flexible layer 20 disposed on the first sub-adhesive layer 702, and comprising a plurality of sub-flexible layers 201 spaced apart from each other, the second sub-adhesive layers 703 disposed at spacing, and the second sub-adhesive layers 703 corresponding to the spacings one-to-one;

an array substrate 30, a light-emitting component 40, and an encapsulation layer 50 sequentially stacked on each of the sub-flexible layers 201; and a cover plate 60 covering and disposed on the encapsulation layer 50 and the second sub-adhesive layers 703.

In some embodiments, a polarizer and a touch panel are further disposed between the encapsulation layer 50 and the cover plate 60. If the light-emitting component 40 is a liquid crystal display (LCD), the polarizer should be attached to the encapsulation layer 50. Imaging of the liquid crystal display must rely on polarized light, and the polarizer is used to dissipate surface reflection and to twist a propagation direction of the polarized light, thereby realizing the functions of enhancing brightness, reducing color saturation, and so on. Polarizers generally used for an LCD usually includes a liquid crystal glass and polarizers attached to opposite surfaces of the liquid crystal glass, and therefore the polarizer usually has a thickness of 1 mm.

It can be understood that when the light-emitting component 40 is an organic light-emitting diode (OLED), in order to prevent external light from being irradiated onto the flexible illuminating panel 100 and being reflected by a metal such as a cathode, adversely affecting the contrast, and the like, a circular polarizer is generally required to weaken the reflection by the cathode or other metal. The touch panel imparts a touch function to the flexible light-emitting panel 100.

In order to maintain the continuity between the adjacent functional layers and the adjacent sub-flexible layers 201, the width of the second sub-adhesive layer 703 disposed at the spacings is the same as the width of the spacings, and the width of the second sub-adhesive layer is 1 to 3 microns. Similarly, in order to prevent the backplate 80 and the cover plate 60 are from peeling off from the functional layers and the flexible layer 20, the thickness of the adhesive layer 70 is the same as the distance from the backplate 80 to the cover plate 60.

In some embodiments, the flexible light-emitting panel 100 includes at least one bending region AA, at which at least one of the plurality of the sub-flexible layers 201 is located.

Figure 7:
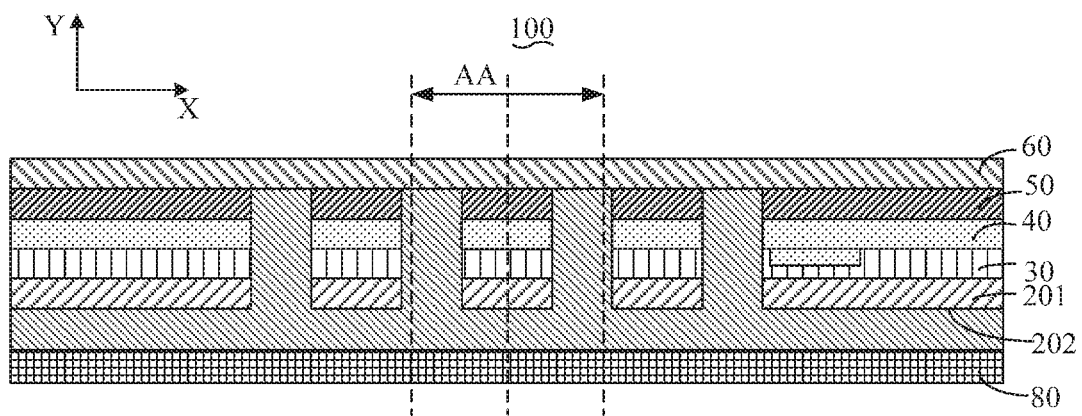
FIG. 7 is a schematic diagram of a second structure of a flexible light-emitting panel according to an embodiment of the present application.

Specifically, as shown in FIG. 7, FIG. 7 is a schematic diagram of a second structure of a flexible light-emitting panel 100 according to an embodiment of the present application. Generally, the flexible light-emitting panel 100 has only one bending area AA. The bending area AA is located at an intermediate position of the flexible light-emitting panel 100. Based on the central axis of the flexible light-emitting panel 100, the bending area AA is a region defined between a site from the central axis to the negative X-axis direction by 2 cm and a site from the central axis to the positive direction of the X-axis by 2 cm. At least one sub-flexible layer 201 is present in the bending region AA, so that the bending region AA can also emit light.

In addition, the flexible light-emitting panel 100 may also have a plurality of bending regions AA, that is, positions of the bending regions is not fixed and not particularly limited, and can be any position, which will not be described herein for brevity.

The flexible light-emitting panel provided by an embodiment of the present invention includes: a backplate; an adhesive layer comprising a first sub-adhesive layer disposed on the backplate and a plurality of second sub-adhesive layers protruding from the first sub-adhesive layer away from the backplate; a flexible layer disposed on the first sub-adhesive layer, and comprising a plurality of sub-flexible layers spaced apart from each other, the second sub-adhesive layers disposed at spacings between the sub-flexible layers, and the second sub-adhesive layers corresponding to the spacings one-to-one; an array substrate, a light-emitting component, and an encapsulation layer sequentially stacked on each of the sub-flexible layers; and a cover plate covering and disposed on the encapsulation layer and the second sub-adhesive layers. The present application can avoid the occurrence of interlayer peeling between a plurality of functional layers of the flexible light-emitting panel, thereby improving the product yield.

The flexible light-emitting panel, the manufacturing method and the display device of the flexible light-emitting panel provided by the embodiments of the present application are described in detail. The principles and embodiments of the present application are described in the foregoing examples. The description is only for helping to understand the technical solution of the present application and its core idea. Those of ordinary skill in the art should understand that one can still modify the technical solutions described in the foregoing embodiments, or replace some of the technical features. The modifications and substitutions do not depart from the scope of the technical solutions of the embodiments of the present application.

What is claimed is:

1. A flexible light-emitting panel, comprising:
   a backplate;
   an adhesive layer comprising a first sub-adhesive layer disposed on the backplate and a plurality of second sub-adhesive layers protruding from the first sub-adhesive layer away from the backplate;
   a flexible layer disposed on the first sub-adhesive layer, and comprising a plurality of sub-flexible layers spaced apart from each other, the second sub-adhesive layers disposed at spacings between the sub-flexible layers, and the second sub-adhesive layers corresponding to the spacings one-to-one;
   an array substrate, a light-emitting component, and an encapsulation layer sequentially stacked on each of the sub-flexible layers; and
   a cover plate covering and disposed on the encapsulation layer and the second sub-adhesive layers.

2. The flexible light-emitting panel according to claim 1, wherein the flexible light-emitting panel comprises at least one bending region, and at least one of the plurality of sub-flexible layers is located in the bending region.

3. The flexible light-emitting panel according to claim 2, wherein the second sub-layer has a width same as a width of the spacing.

4. The flexible light-emitting panel according to claim 3, wherein the adhesive layer has a thickness same as a distance from the backplate to the cover plate.

5. The flexible light-emitting panel according to claim 4, wherein the second sub-layer has a width of 1 to 3 microns.

6. The flexible light-emitting panel according to claim 1, further comprising a polarizer and a touch panel disposed between the encapsulation layer and the cover plate, wherein the polarizer is disposed on the encapsulation layer, and the touch panel is disposed on the polarizer.

7. A method of manufacturing a flexible light-emitting panel, comprising:
providing a substrate;
coating a plurality of sub-flexible layers spaced apart from each other on the substrate to form a flexible layer on the substrate;
forming an array substrate, a light-emitting component, and an encapsulation layer sequentially on each of the plurality of sub-flexible layers, and disposing a cover plate covering the encapsulation layer;
peeling off the substrate, applying an adhesive to a first surface of the flexible layer away from the encapsulation layer and spacings between adjacent ones of the sub-flexible layers, and curing the adhesive to form an adhesive layer; and
attaching a backplate to a second surface of the adhesive layer away from the encapsulation layer.

8. The method of manufacturing the flexible light-emitting panel according to claim 7, wherein the step of peeling off the substrate comprises:
irradiating the substrate with laser under vacuum to peel off the substrate from the flexible layer.

9. The method of manufacturing the flexible light-emitting panel according to claim 8, wherein the step of applying an adhesive to a first surface of the flexible layer away from the encapsulation layer and spacings between adjacent ones of the sub-flexible layers, and curing the adhesive to form an adhesive layer comprises:
applying the adhesive to the first surface of the flexible layer away from the encapsulation layer and the spacings between adjacent ones of the sub-flexible layers; and
curing the adhesive by UV light to form the adhesive layer.

10. A display device, comprising:
a backplate;
an adhesive layer comprising a first sub-adhesive layer disposed on the backplate and a plurality of second sub-adhesive layers protruding from the first sub-adhesive layer away from the backplate;
a flexible layer disposed on the first sub-adhesive layer, and comprising a plurality of sub-flexible layers spaced apart from each other, the second sub-adhesive layers disposed at spacings between the sub-flexible layers, and the second sub-adhesive layers corresponding to the spacings one-to-one;
an array substrate, a light-emitting component, and an encapsulation layer sequentially stacked on each of the sub-flexible layers; and
a cover plate covering and disposed on the encapsulation layer and the second sub-adhesive layers;
wherein the flexible light-emitting panel comprises at least one bending region, and at least one of the plurality of sub-flexible layers is located in the bending region; and
wherein the display device further comprises a polarizer and a touch panel disposed between the encapsulation layer and the cover plate, wherein the polarizer is disposed on the encapsulation layer, and the touch panel is disposed on the polarizer.

11. The flexible light-emitting panel according to claim 10, wherein the second sub-layer has a width same as a width of the spacing.

12. The flexible light-emitting panel according to claim 11, wherein the adhesive layer has a thickness same as a distance from the backplate to the cover plate.

13. The flexible light-emitting panel according to claim 12, wherein the second sub-layer has a width of 1 to 3 microns.

* * * * *